United States Patent
Miller et al.

[11] Patent Number: 6,072,211
[45] Date of Patent: Jun. 6, 2000

[54] SEMICONDUCTOR PACKAGE

[75] Inventors: Gerald R. Miller, Scottsdale; Lakshminarayan Viswanathan, Phoenix; Alan D. Wood, Mesa, all of Ariz.

[73] Assignee: Motorola, Inc., Schaumburg, Ill.

[21] Appl. No.: 09/128,022

[22] Filed: Aug. 3, 1998

[51] Int. Cl.[7] .................... H01L 27/108; H01L 29/76; H01L 29/94; H01L 31/119
[52] U.S. Cl. .................... 257/308; 257/735; 257/723
[58] Field of Search ................... 257/735, 723, 257/724, 684, 301, 302, 303, 308, 310, 747; 438/125

[56] References Cited

U.S. PATENT DOCUMENTS

| | | | |
|---|---|---|---|
| 3,617,817 | 11/1971 | Kawakatsu | 257/724 |
| 3,784,884 | 1/1974 | Zoroglu . | |
| 3,801,938 | 4/1974 | Goshgarian . | |
| 4,617,586 | 10/1986 | Cuvilliers | 257/724 |
| 4,953,001 | 8/1990 | Kaiser et al. . | |
| 5,049,979 | 9/1991 | Hashemi et al. | 257/724 |
| 5,103,283 | 4/1992 | Hite | 257/724 |
| 5,371,405 | 12/1994 | Kagawa . | |
| 5,477,085 | 12/1995 | Kose . | |
| 5,602,421 | 2/1997 | Li . | |
| 5,767,564 | 6/1998 | Kunimatsu et al. | 257/724 |

OTHER PUBLICATIONS

Ted Johansson, "Inside the RF Power Transistor," RF Power Transistors Data Book, pp. 85–90, Jun. 1997.

*Primary Examiner*—Sheila V. Clark
*Attorney, Agent, or Firm*—Robert F. Hightower; A. Kate Huffman

[57] ABSTRACT

A semiconductor package (10) forms an impedance matching capacitor by utilizing an insulator (12), a conductor (19) on the dielectric, and a substrate (11) as elements of the capacitor. The capacitor is electrically connected, as part of an impedance matching network to shunt the inductance of the bonding wires (21) that connect the semiconductor die (18) an input lead (17).

14 Claims, 2 Drawing Sheets

SEMICONDUCTOR PACKAGE

BACKGROUND OF THE INVENTION

The present invention relates, in general, to semiconductor devices, and more particularly, to a semiconductor device package.

In the past, the semiconductor industry utilized unique packages for high power dissipation (typically greater than ten watts) radio frequency (RF) applications. Typically, these applications operate at frequencies greater than about five hundred Mega Hertz (MHz). Because of the high frequency operation, bonding wires that connect the active semiconductor devices to external leads function as parasitic inductors that reduce the efficiency of the semiconductor device. In order to optimize the input and output transmission line impedances, shunt capacitors are added in parallel with the bonding wire. Typically the shunt capacitor is attached adjacent the active semiconductor die on the semiconductor die attachment area of the package. Bonding wires are then utilized to electrically connect the capacitor to the lead and to the semiconductor die.

It is difficult to select appropriate capacitor values that match the input impedance of the package to the output impedance of the external device driving the semiconductor device. This limits the efficiency that can be obtained. Additionally, these capacitors add cost to the finished semiconductor package thereby increasing the manufacturing costs. Further, the space utilized by the shunt capacitors increase the package size further increasing the manufacturing costs.

Accordingly, it is desirable to have an impedance matching package that results in high efficiency operation, and that reduces manufacturing costs.

DETAILED DESCRIPTION OF THE DRAWINGS

Figure 1:
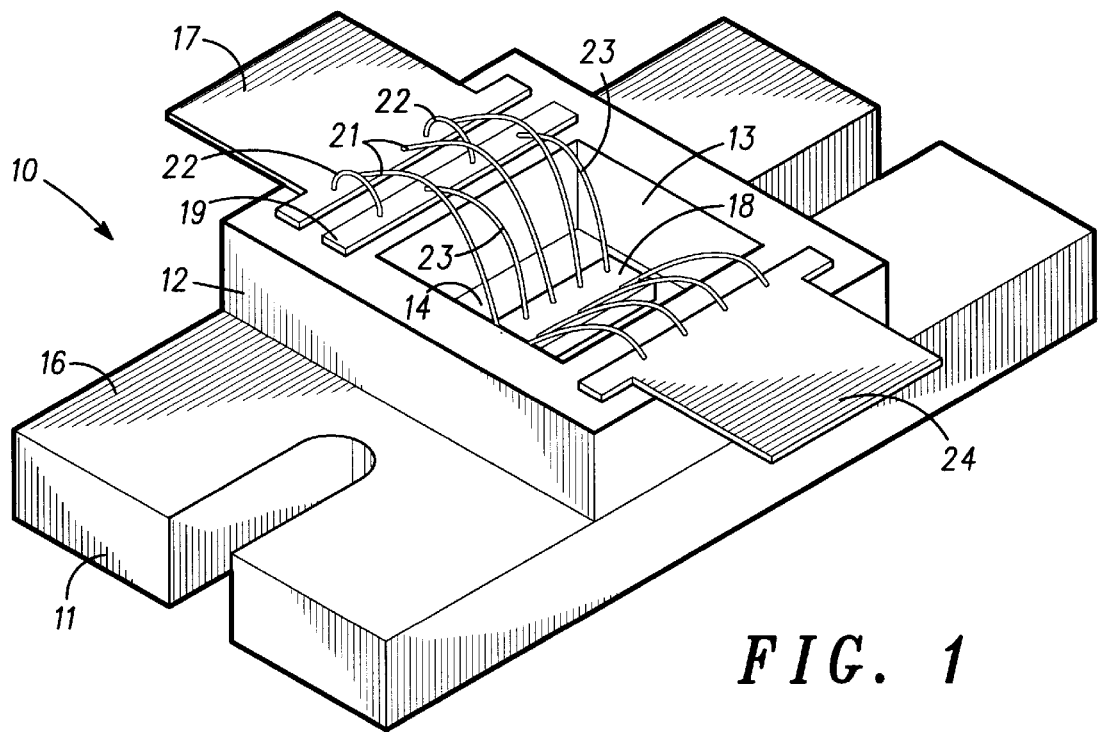
FIG. 1 schematically illustrates an isometric view of a semiconductor package according to the present invention.

FIG. 1 schematically illustrates an isometric view of a high efficiency low cost semiconductor package 10. Package 10 has a substrate 11 that is formed from an electrically conductive material that has a low coefficient of thermal expansion, such as less than 17 ppm/° C., in order to substantially match the CTE of an active semiconductor device 18. Substrate 11 typically is rectangular in shape and may have slots or holes at each end for mounting package 10. Substrate 11 functions as a heat sink to cool device 18.

An insulator 12 is attached to substrate 11 and is used to electrically isolate substrate 11 from an input lead 17 and an output lead 24. Insulator 12 is formed from an electrically insulating material including polymers, or ceramics such as aluminum oxide ($Al_2O_3$) and aluminum nitride (AlN), or other similar materials. Insulator 12 is attached to substrate 11 by techniques that are well known to those skilled in the art. Insulator 12 has an opening 13 through insulator 12 so that a first portion 14 of the surface of substrate 11 is exposed inside of opening 13. A second portion 16 of the surface of substrate 11 is exposed external to insulator 12. Semiconductor device 18 is attached to portion 14 of substrate 11. Leads 17 and 24 are attached to a top surface of insulator 12 typically along a long side of substrate 11 and oriented in order to attach bonding wires from leads 17 and 24 to device 18.

Package 10 has a capacitor passive element formed by using insulator 12 as a dielectric, a conductor 19 formed on the top surface of insulator 12 as a first plate, and substrate 11 as a second plate of the capacitor. Conductor 19 is formed on the top surface of insulator 12 adjacent to input lead 17 and overlies a portion of substrate 11 in order to form the capacitor. The value of the capacitor is adjusted by adjusting the area of conductor 19, and the thickness and dielectric constant of insulator 12 in order to form the desired capacitor value. The dielectric constant can be varied by changing the composition of the $Al_2O_3$ or other material used for insulator 12, or by varying the material used for insulator 12.

By way of example, in order to form a capacitor value of five pico farads, insulator 12 may be formed of $Al_2O_3$ having a dielectric constant of 9.4 and a thickness of approximately three hundred eighty microns with conductor 19 having an area of about twenty three square milli-meters. The resulting package provides an efficiency improvement at least five percent greater than prior implementations.

The capacitor is electrically connected as a shunt capacitor across the bonding wires that connects input lead 17 to device 18. For example, bonding wires 21 may connect lead 17 to device 18 and bonding wires 22 may connect lead 17 to conductor 19. Alternately, bonding wires 22 may connect lead 17 to conductor 19 and leads 23 connect conductor 19 to device 18. Thus, the capacitor is an impedance matching element that is formed by utilizing insulator 12 as a portion of the impedance matching element. The impedance matching element shunts the inductance of bonding wires 21 in order to optimize the impedance of package 10.

In the preferred embodiment, the capacitor formed from conductor 19 extends the length of device 18 to facilitate each individual active element of device 18 having the same electrical load.

Figure 2:
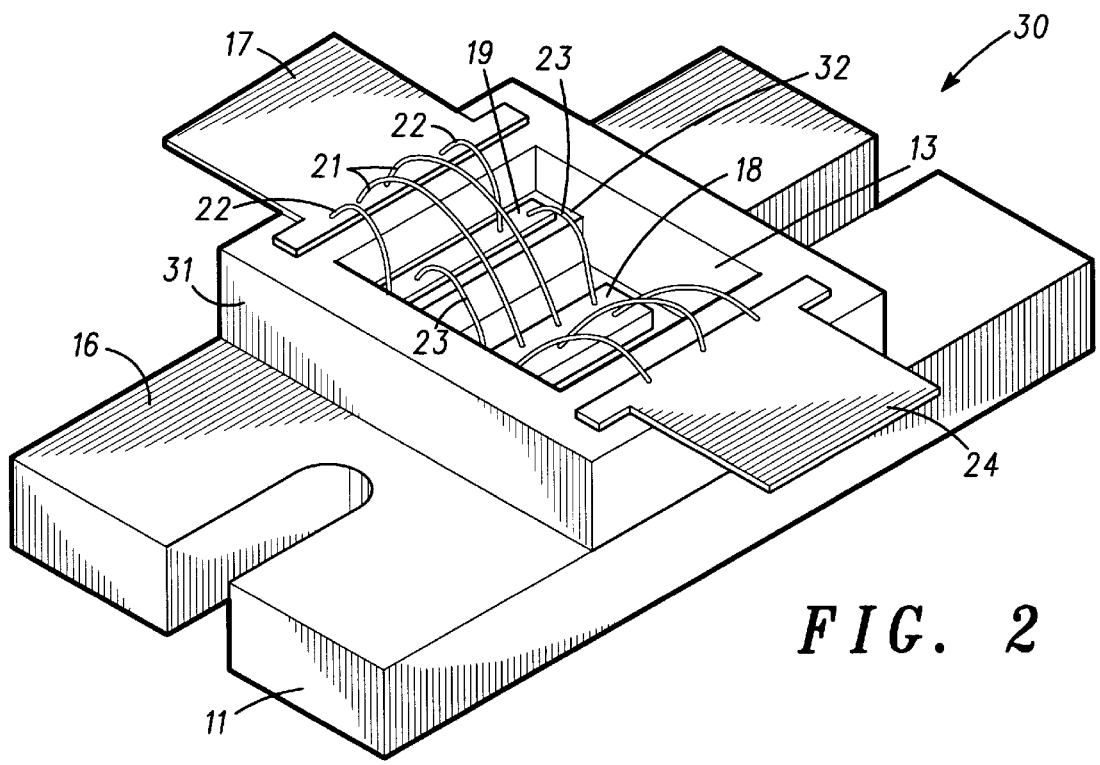
FIG. 2 schematically illustrates an isometric view of an alternate embodiment of the package of FIG. 1 according to the present invention.

FIG. 2 schematically illustrates a package 30 that is an alternate embodiment of package 10 shown in FIG. 1. The same reference numbers are used to identify the same elements in FIG. 1 and FIG. 2. Package 30 has an insulator 31 that is similar to insulator 12 of FIG. 1. However, insulator 31 has a shelf 32 that is an area recessed from the top surface of insulator 31 so that conductor 19 may be closer to substrate 11 in order to adjust the value of the capacitor formed from conductor 19.

Figure 3:
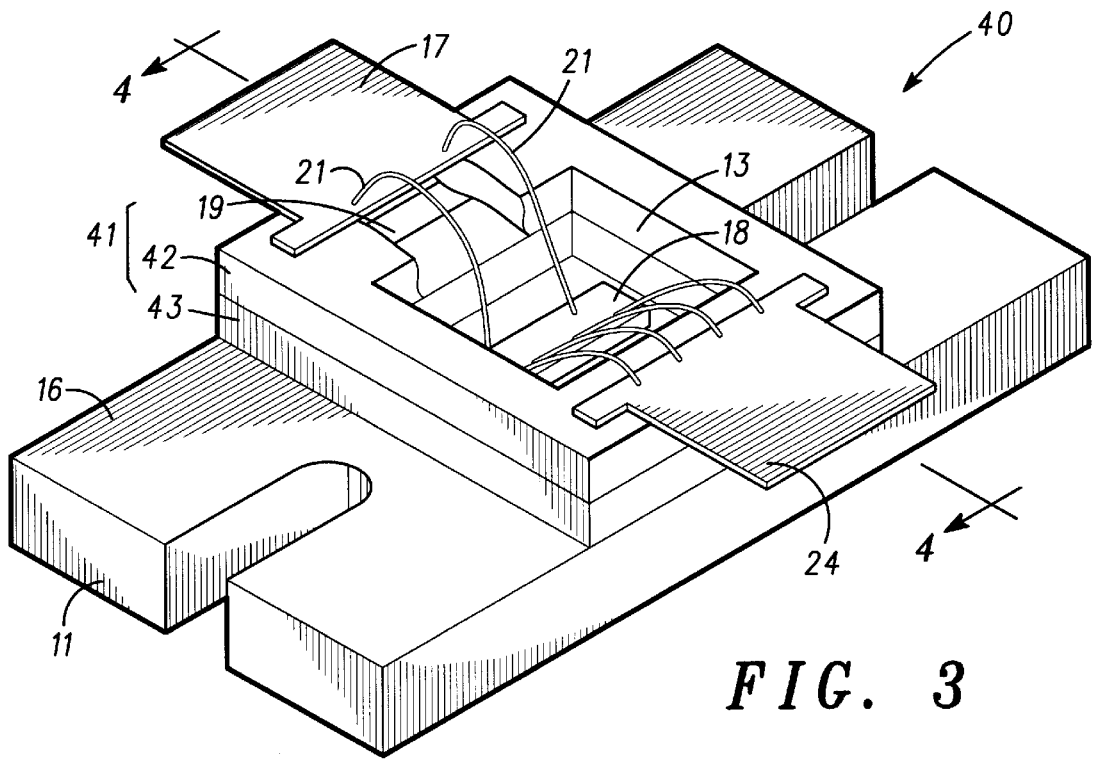
FIG. 3 illustrates an isometric view of another embodiment of the package of FIG. 1 according to the present invention.

FIG. 3 illustrates a package 40 that is another embodiment of package 10 shown in FIG. 1. The same reference numbers are used to identify the same elements in FIG. 1 and FIG. 3. Package 40 has an insulator 41 that is similar to insulator 12 of FIG. 1. However, insulator 41 is formed in two portions, for example two halves. A top portion 42 and a bottom portion 43 that are attached with techniques well known to those skilled in the art. The thickness of each of portions 42 and 43 may be adjusted to obtain a particular capacitance value. Electrical conductor 19 is formed on a top surface of portion 43 before portion 42 is attached to portion 43.

Figure 4:
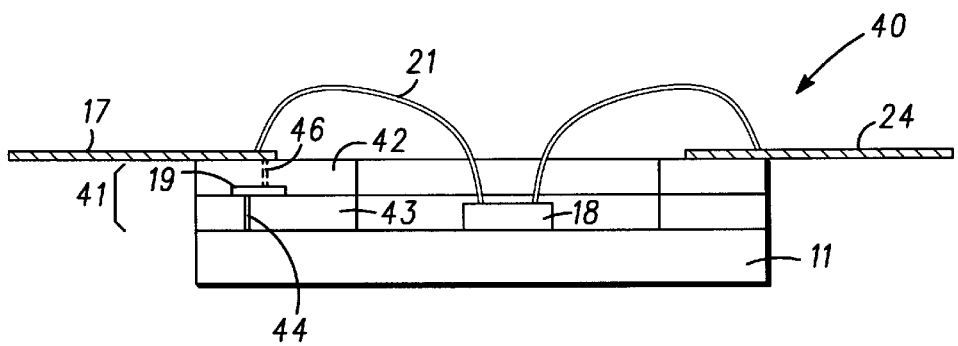
FIG. 4 illustrates a cross-sectional portion of the package of FIG. 3 according to the present invention.

FIG. 4 illustrates a cross section along cross sectional line 4—4 shown in FIG. 3. Conductor 19 is electrically connected to substrate 11 through a via or a plurality of vias 44 that extend from conductor 19 through bottom half 43 to electrically contact substrate 11. In this configuration, conductor 19 forms one plate of the shunt capacitor and is electrically connected to device 18 through via 44 and substrate 11 while input lead 17 forms the other plate of the capacitor. Alternately, conductor 19 can be electrically connected to lead 17 through a via 46, illustrated by a dashed line, so that the capacitor is formed by conductor 19 and substrate 11.

Figure 5:
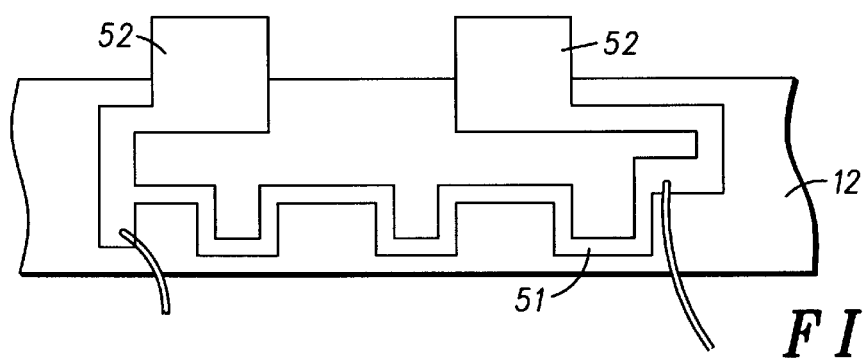
FIG. 5 illustrates a plan view of a portion of another embodiment of the package of FIG. 1 according to the present invention.

FIG. 5 illustrates a plan view of a portion of another embodiment of package 10 shown in FIG. 1. Insulator 12 has two input leads 52 formed on the top surface of insulator 12. An inductor passive element 51 is also formed as a conductor in a serpentine pattern on the top surface of insulator 12. Each end of element 51 is connected to one of the leads 52 in order to form an inductor in parallel with the leads. Element 51 may have a variety of different patterns that provide and inductive effect including but not limited to a spiral pattern.

Those skilled in the art, will recognize that the capacitor can be formed adjacent to output lead 24 using the same methods for forming the capacitor adjacent to lead 17.

By now it should be appreciated that there has been formed a novel semiconductor package. Utilizing the insulator to form a shunt capacitor reduces manufacturing costs by eliminating the need of an additional capacitor element attached to the substrate. This also allows the package to have a narrower width because no space is required for additional capacitive elements and fewer wire bonds are required thereby further reducing the manufacturing costs of the package. Utilizing a conductor on the insulator to form the capacitor facilitates forming small capacitor values that may be difficult to obtain in other forms.

What is claimed is:

1. An impedance matching semiconductor package comprising:

an electrically conductive substrate;

an insulator on the electrically conductive substrate, the insulator having a top surface and an opening through the insulator that exposes a portion of the electrically conductive substrate wherein a portion of the electrically conductive substrate is external to the insulator;

a lead on the top surface of the insulator; and a passive element having a conductor on the top surface of the insulator and overlying a portion of the electrically conductive substrate to form an impedance matching semiconductor package, the conductor being a first plate of a capacitor and the electrically conductive substrate forming a second plate of the capacitor.

2. The package of claim 1 further including the passive element electrically coupled to the lead.

3. The package of claim 1 wherein the insulator is one of a ceramic or a polymer.

4. The package of claim 1 wherein the passive element is an inductor.

5. The package of claim 1 further including a semiconductor die on the exposed portion of the electrically conductive substrate wherein the semiconductor die is electrically coupled to the lead and to the conductor.

6. A semiconductor package comprising:

an electrically conductive substrate;

an insulator on the electrically conductive substrate, the insulator having a top surface and an opening through the insulator that exposes a first portion of the electrically conductive substrate wherein a second portion of the electrically conductive substrate is exposed external to the insulator;

a lead of the package formed as a first conductor on the top surface of the insulator; and a capacitor having a first plate that is a second conductor on the insulator and overlying a portion of the electrically conductive substrate that is a second plate of the capacitor.

7. The package of claim 6 further including a semiconductor die on the first portion of the electrically conductive substrate wherein the semiconductor die is electrically coupled to the lead and to the second conductor.

8. The package of claim 7 wherein the insulator has a thickness that is greater than a thickness of the semiconductor die and less than a thickness of the electrically conductive substrate.

9. The package of claim 6 wherein the insulator is one of a ceramic or a polymer.

10. A semiconductor package comprising:

an electrically conductive substrate an insulator on the substrate, the insulator having a top surface and an opening through the insulator that exposes a first portion of the electrically conductive substrate wherein a second portion of the electrically conductive substrate is exposed external to the insulator;

a lead of the package formed as a first conductor on the top surface of the insulator; and a passive element having a second conductor within the insulator and overlying a portion of the electrically conductive substrate, the second conductor being disposed on a portion of the insulator that is thinner than a portion of the insulator underlying the lead.

11. The package of claim 10 further including a semiconductor die on the first portion of the electrically conductive substrate wherein the semiconductor die is electrically coupled to the lead and to the second conductor.

12. The package of claim 10 wherein the second conductor is electrically connected to one of the electrically conductive substrate or the lead.

13. A method of forming an impedance matching package comprising:

forming an insulator layer on an electrically conductive substrate, the insulator having a top surface and an opening through the insulator that exposes a portion of the electrically conductive substrate wherein a portion of the electrically conductive substrate is external to the insulator; and using a portion of the insulator layer as a portion of an inductor.

14. The method of claim 13 wherein the impedance matching element is a capacitor.

* * * * *